(12) United States Patent
Chen et al.

(10) Patent No.: US 6,372,640 B1
(45) Date of Patent: Apr. 16, 2002

(54) METHOD OF LOCALLY FORMING METAL SILICIDE LAYERS

(75) Inventors: Ying-Tso Chen, Kaohsiung; Erh-Kun Lai, Taichung; Hsin-Huei Chen, Miao-Li; Shou-Wei Hwang, Chilung; Yu-Ping Huang, Taichung, all of (TW)

(73) Assignee: Macronix International Co., Ltd. (TW)

( * ) Notice: Subject to any disclaimer, the term of this patent is extended or adjusted under 35 U.S.C. 154(b) by 0 days.

(21) Appl. No.: 09/917,645

(22) Filed: Jul. 31, 2001

(51) Int. Cl.[7] .............................................. H01L 21/44
(52) U.S. Cl. ...................... 438/656; 438/592; 257/412; 257/754; 257/761; 257/764
(58) Field of Search ................................ 438/592, 655, 438/656; 257/410, 754, 761, 764

(56) References Cited

U.S. PATENT DOCUMENTS

| | | | | |
|---|---|---|---|---|
| 5,444,023 A | * | 8/1995 | Homma ........................ 438/655 |
| 5,518,959 A | * | 5/1996 | Jang et al. ................... 438/655 |
| 5,527,738 A | * | 6/1996 | Koh et al. .................... 438/592 |
| 5,691,236 A | * | 11/1997 | Chu ............................. 438/592 |
| 5,776,823 A | * | 7/1998 | Agnello et al. ............. 438/592 |
| 6,010,961 A | * | 1/2000 | Hu .............................. 438/655 |
| 6,136,677 A | * | 10/2000 | Prein ........................... 438/592 |
| 6,169,025 B1 | * | 1/2001 | Kuo ............................ 438/630 |
| 6,171,954 B1 | * | 1/2001 | GHsu .......................... 438/656 |

FOREIGN PATENT DOCUMENTS

| JP | 2000307086 | * 11/2000 | ......... H01L/27/108 |
|---|---|---|---|

* cited by examiner

Primary Examiner—Charles Bowers
Assistant Examiner—David S Blum

(57) ABSTRACT

The present invention mainly provides a method to locally form metal silicide on an integral circuit and to avoid the phenomenon of leakage current which is caused by metal silicide formed between the memory cells on the same word line.

The method of the present invention achieves the above objectives by principally using a design rule to adequately arrange elements within a proper distance. In an embodiment, in order to form metal silicide layers on an integral circuit and to avoid metal silicide formed between two neighboring memory cell on the same word line, a dielectric layer is first formed in the spaced region between the two neighboring memory cells to be used as a mask. Thus, in a following selective etching process, a part of the silicon substrate within the above spaced region can be protected and not exposed. Therefore, no metal silicide is formed in the spaced region, and the above objective is achieved.

13 Claims, 8 Drawing Sheets

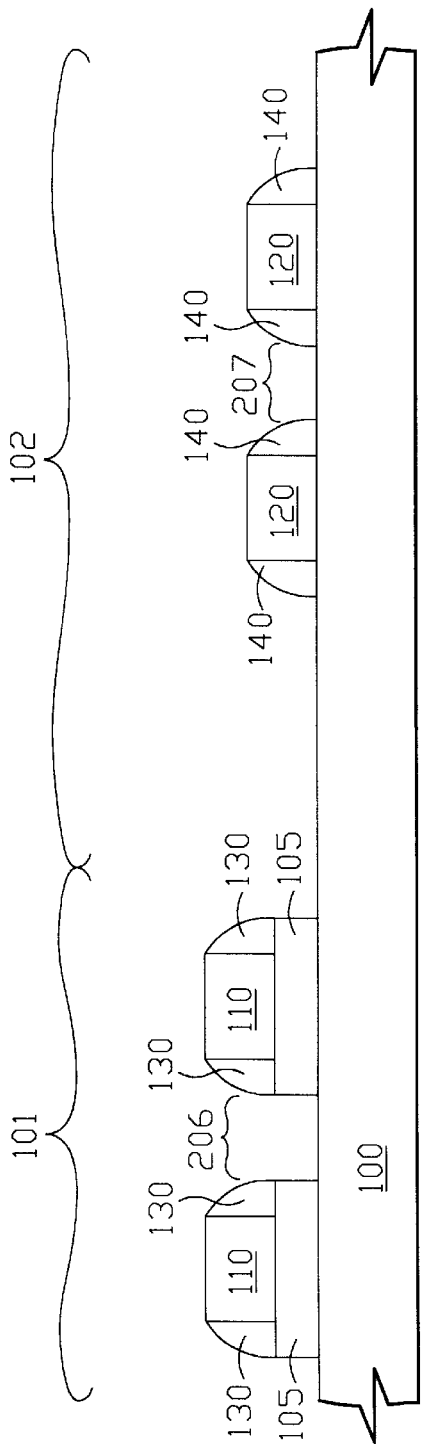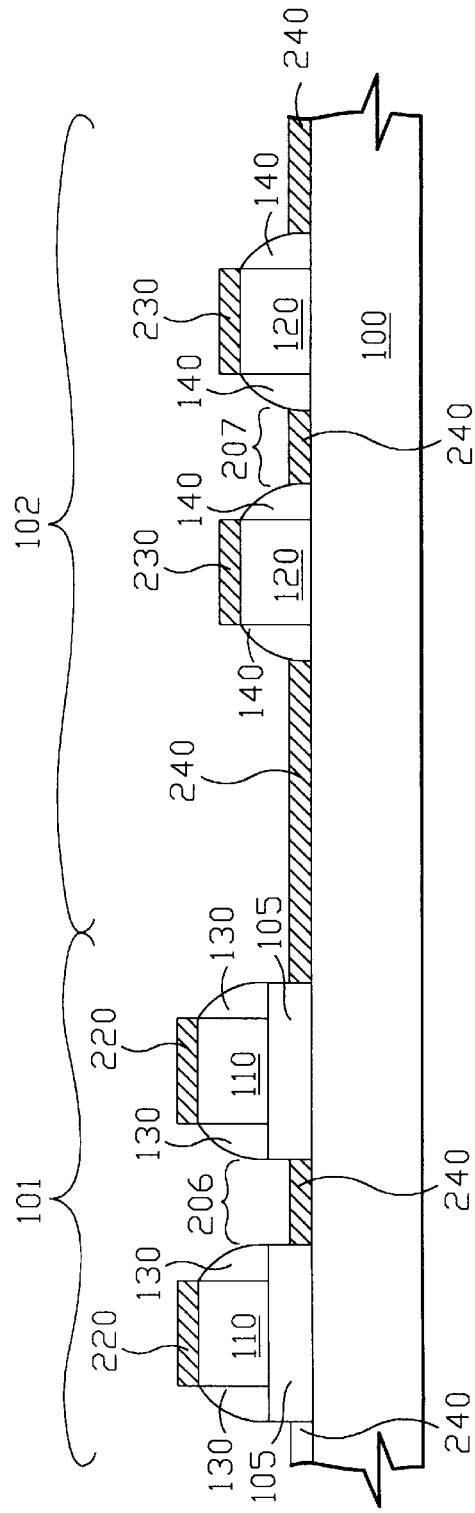
FIG.2A (Prior Art)
FIG.2B (Prior Art)

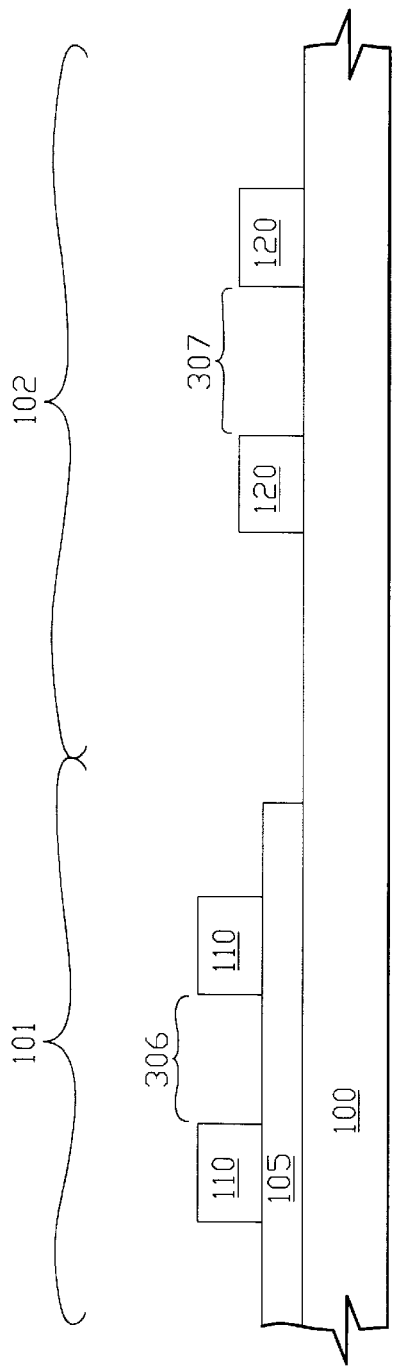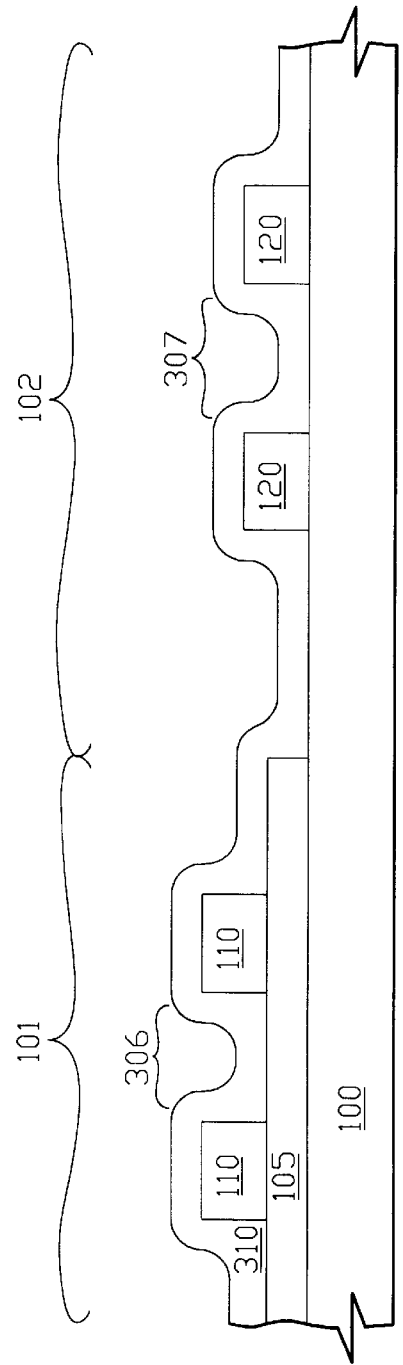

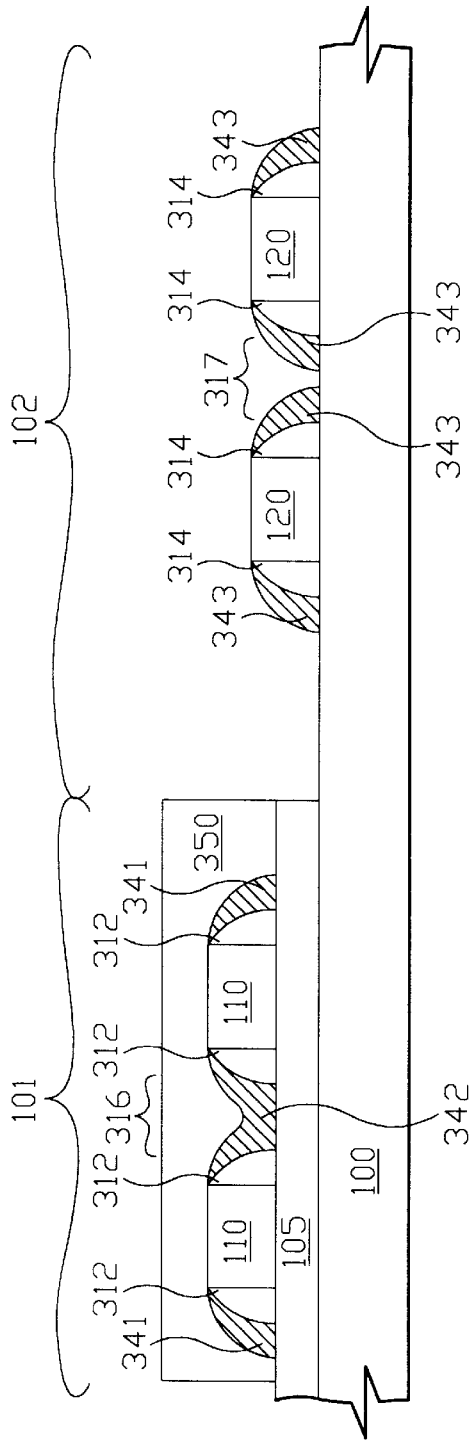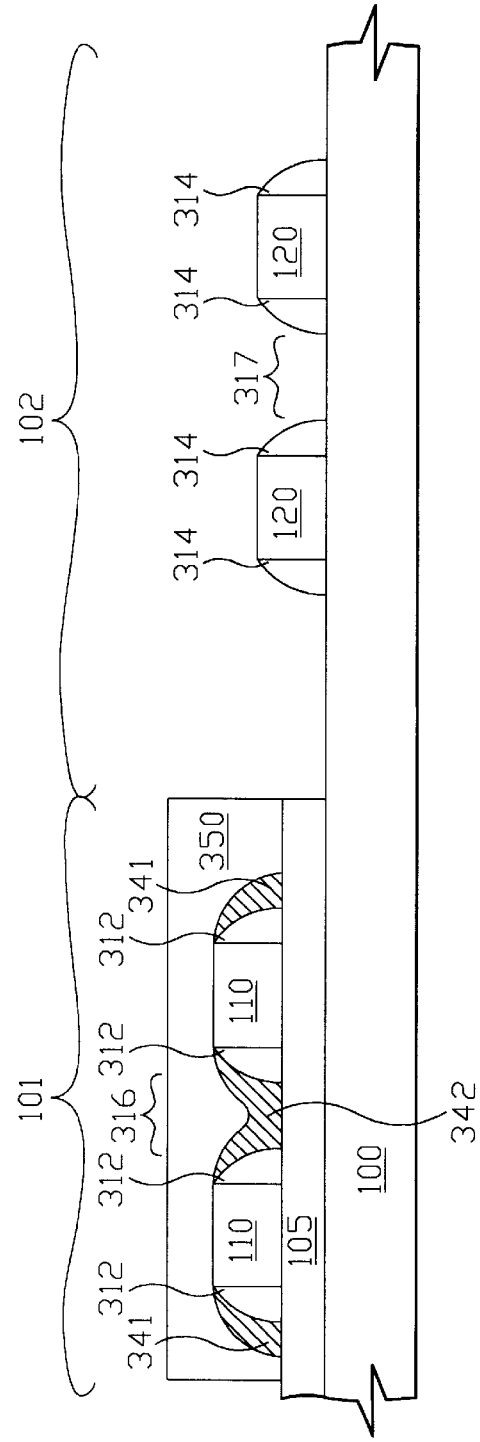

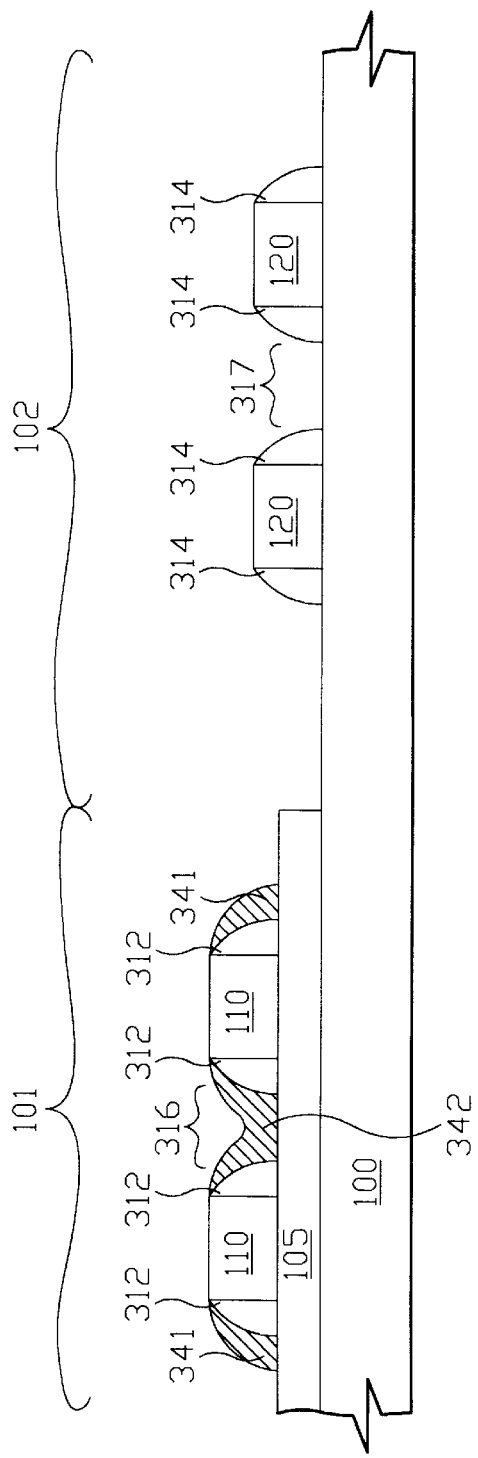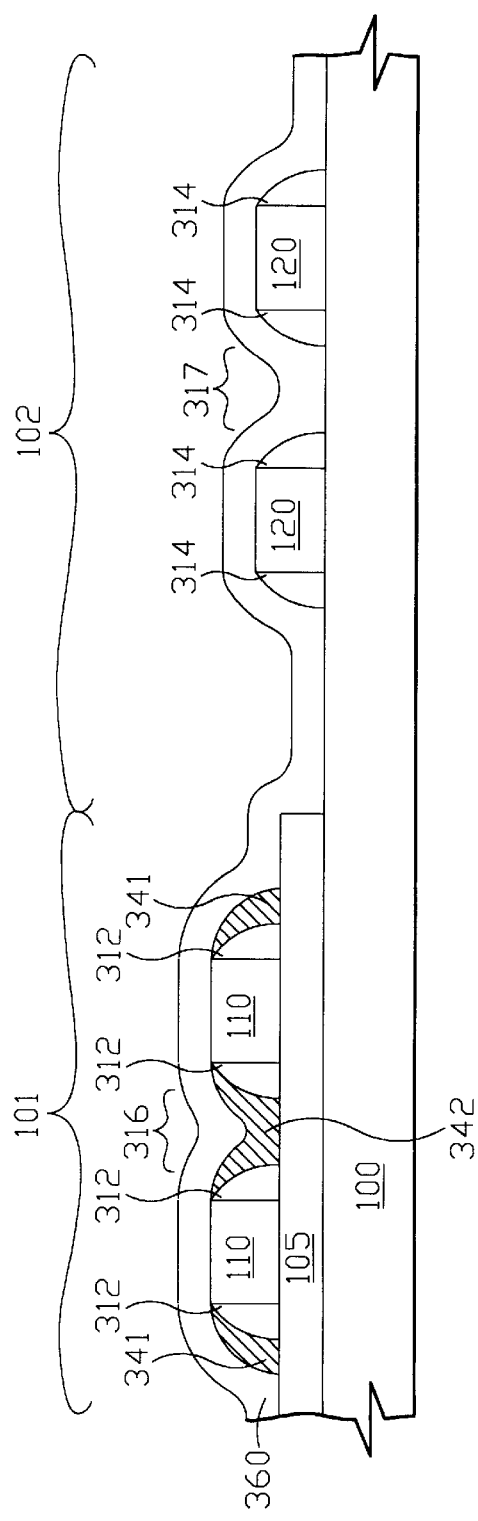

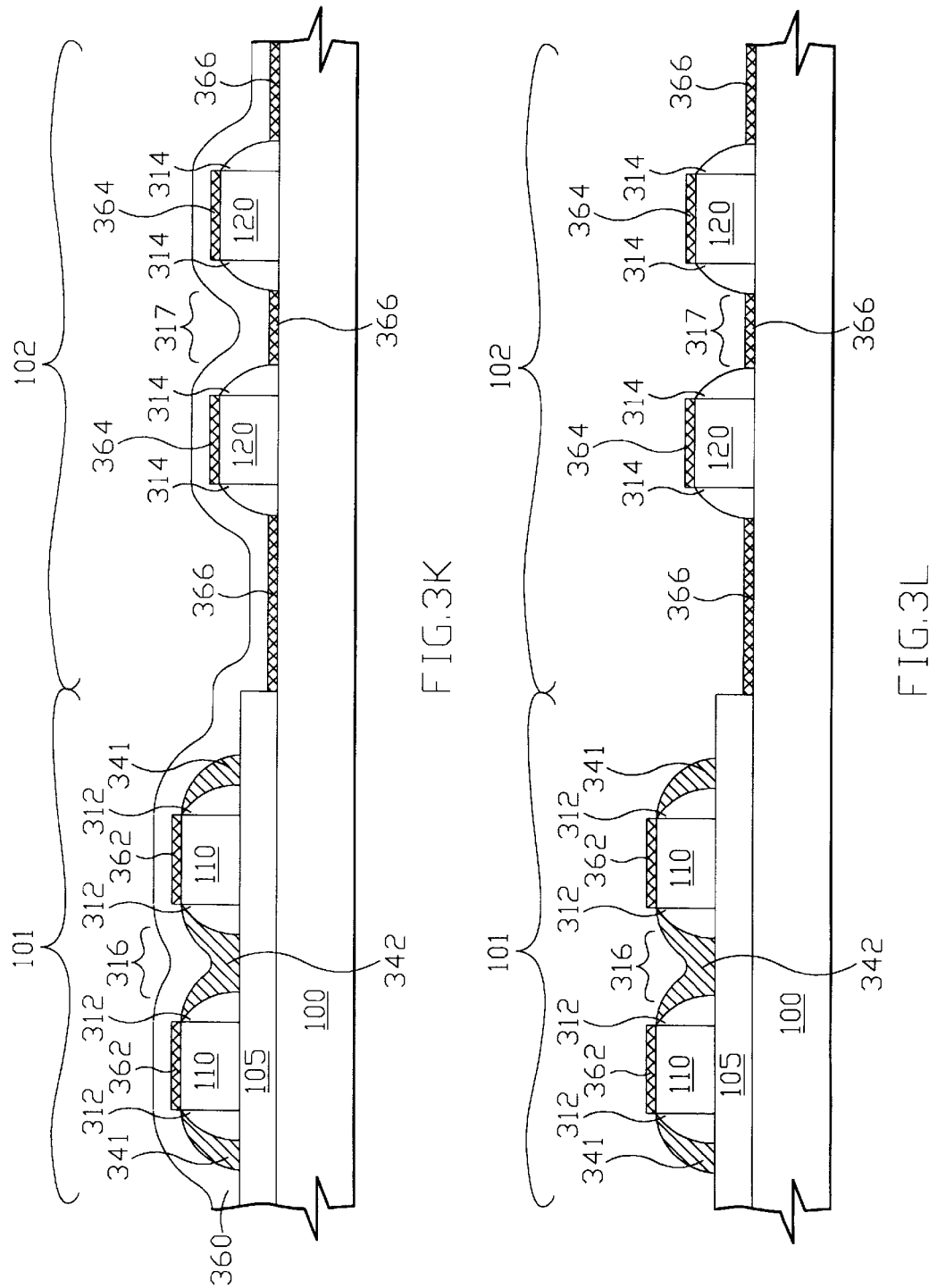

METHOD OF LOCALLY FORMING METAL SILICIDE LAYERS

BACKGROUND

1. Field of the Invention

The present invention generally relates to a method of locally forming metal silicide layers, and in particular to a method of locally forming metal silicide layers and avoiding a leakage current between memory cells caused by unwanted metal silicides.

2. Description of the Prior Art

In order to reduce the resistance and improve the performance of an integral circuit, a metal silicide layer, such as titanium silicide, is usually deposited upon the surface of the circuit and elements. But in some regions where the resistance has to be kept high, such as the spaced region between two neighboring memory cells on the same word line, the metal silicide layer should be avoided. A conventional method is shown in FIG. 1: first, a silicon substrate 100 is provided. There are at least two regions on the substrate 100: one is an array region 101, the other is a peripheral region 102. In the array region 101, a dielectric layer 105, such as an oxide-nitride-oxide (ONO) layer, is deposited on the substrate 100. A memory array with gates 110 and sidewalls 130 is formed on the dielectric layer 105, wherein a first spaced region 106 exists between two neighboring memory cells on the same word line. In the peripheral region 102, there's at least a plurality of gates 120 of transistors and the sidewalls 140 of the gates 120, wherein a second spaced region 107 exists between two neighboring transistors. After a process of forming metal silicide, the metal silicide layers (150,160,170) are formed on the top surface of gates 110 of memory cells, the top surface of gates 120 of transistors, and the surface of silicon substrate 100.

However, within the prior method the process for forming the sidewall 130 of gates 100 of the memory cells is hard to control, so an overetching phenomenon frequently occurs to expose a part of the substrate 100 within the first spaced region 206, as shown in FIG. 2A. Thus a metal silicide layer 240 is also formed on the surface of silicon substrate 100 within the first spaced region 206 when the process of forming metal silicide is carried out. As shown in FIG. 2B, the metal silicide layer 240 on the surface of silicon substrate 100 within the first spaced region 206 will cause the leakage current, and degrade the performance of the memory cells.

SUMMARY

It is an object of the invention to provide a method for locally forming metal silicide layers on an integral circuit.

It is another object of the invention to provide a method to avoid a leakage current caused by the formation of metal silicide layers between memory cells on the same word line.

According to the foregoing objects, the present invention provides a method comprising the following steps: first, a silicon substrate is provided. The silicon substrate can be divided into at least two regions: one is the array region, the other is the periphery region. In the array region, an ONO layer is deposited on the substrate, and a plurality of first transistors, such as a memory array, is formed on the ONO layer. A first spaced region exists between any two neighboring transistors of the plurality of the first transistors. In the peripheral region, a plurality of second transistors is formed on the substrate, and a second spaced region exists between any two neighboring transistors of the plurality of the second transistors. The second spaced region is larger than the first spaced region. Afterward, a nitride layer is conformally deposited to cover the surface of the substrate, the array region, the plurality of the first transistors, the peripheral region, and the plurality of the second transistors. Then, an etching step is performed to form the sidewall of the plurality of the first transistors and the sidewall of the plurality of the second transistors. The first spaced region between two neighboring first transistors is therefore reduced and becomes a third spaced region, similarly, the second spaced region between two neighboring second transistors is also reduced to become a fourth spaced region. However the width of the third spaced region remains smaller than that of the fourth spaced region. Afterward, a first silicon oxide layer is conformally deposited to cover the overall array region and the overall peripheral region. Then, an ion implantation is performed to form the sources and drains of the plurality of the first transistors and the plurality of the second transistors. After the ion implantation process, an extra step of rapid thermal process (RTP) may be performed. Then, a second silicon oxide layer is deposited on the first silicon oxide layer. A selective etching process is then performed to remove a part of the first silicon oxide layer and a part of the second silicon oxide layer, so that the top surface of gates of the plurality of the first transistors and the plurality of the second transistors is exposed. However, the silicon oxide layer within the third spaced region remains to avoid exposing the surface of the substrate. A photoresist layer is then formed to cover the overall array region and the overall peripheral region. The part of the photoresist layer within the peripheral region is then removed. By using the remaining photoresist layer as a mask, another etching process is performed to completely remove the oxide layer within the peripheral region. Afterward, the remaining photoresist layer is removed; a metal layer is then deposited to cover the silicon substrate, the array region and the peripheral region. A heating process is then executed to form metal silicide. Finally, the metal layer is removed.

BRIEF DESCRIPTION OF THE DRAWINGS

The foregoing aspects and many of the accompanying advantages of this invention will become more readily appreciated as the same becomes better understood by reference to the following detailed description, when taken in conjunction with the accompanying drawings, wherein:

FIG. 2A to FIG. 2B show a series of schematic cross-sectional diagrams of an embodiment according to the conventional method in which an overetching phenomenon occurs; and FIG. 3A to FIG. 3L show a series of schematic cross-sectional diagrams of an embodiment according to the present method of locally forming metal silicide layers on an integral circuit.

DESCRIPTION OF THE PREFERRED EMBODIMENT

Figure 1:
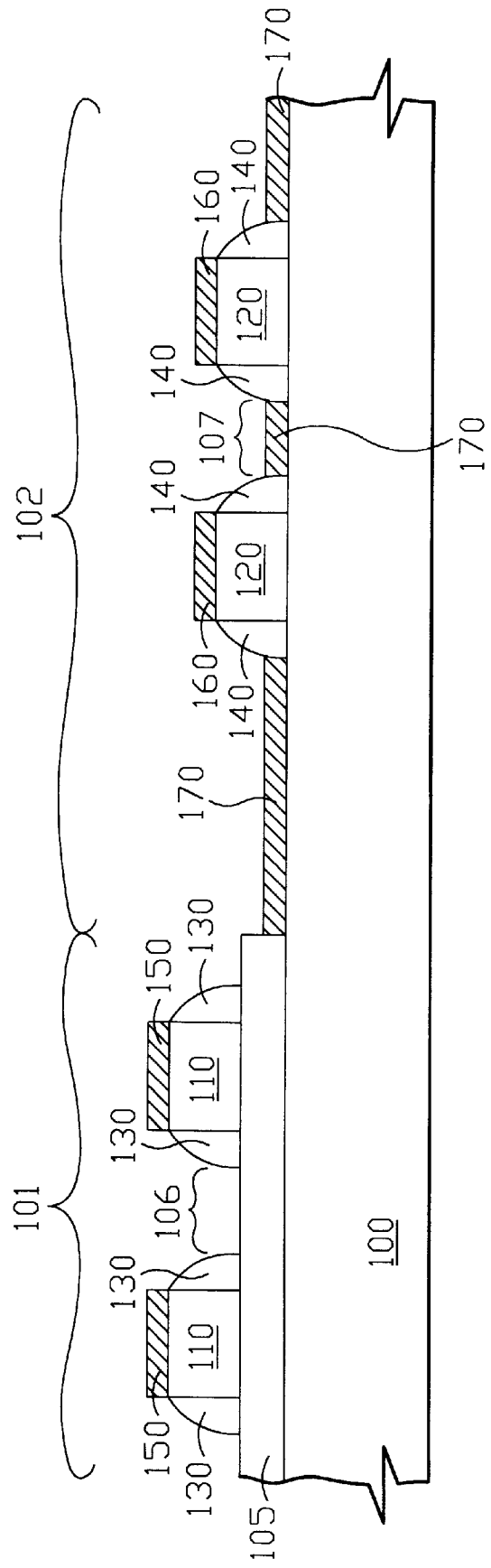
FIG. 1 shows a schematic cross-sectional diagram of a conventional method of locally forming metal silicide layer on a integral circuit.

In the present invention we provide a method to locally form metal silicide layers on an integral circuit, wherein the method comprises the following steps; first, as shown in FIG. 3A, a substrate 100 is provided with at least two regions. One is the array region 101; the other is the peripheral region 102. In the array region, an ONO layer is deposited on the substrate 100, and a memory array is formed on the ONO layer 105. The gates 110 of the memory cell are two neighboring gates on the same word line, and a first spaced region 306 exists between them. In the peripheral region 102, at least a plurality of gates 120 of transistors and a second spaced region 307 exist between two neighboring gates 120 of transistors. The width of the second spaced region 307 is larger than that of the first spaced region 306. In this embodiment, the width of the gates 110 of the memory cells is about 0.38 angstrom, and the width of the first spaced region 306 between two neighboring gates 110 of memory cells is about 0.32 angstrom. The width of the gates 120 of the transistors is about 0.24 angstrom, and the width of the second spaced region 307 between two neighboring gates 110 of transistors is about 0.36 angstrom. The thickness of the gates 110 of the memory cells and the gates 120 of the transistors is about 0.25 angstrom.

Figure 3C:
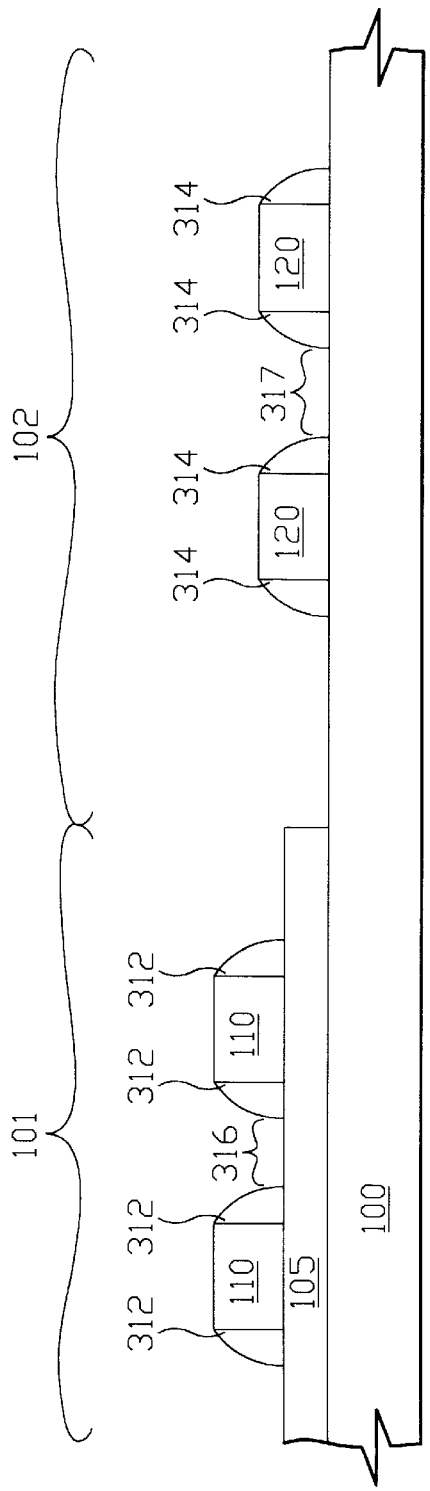
Figure 3D:
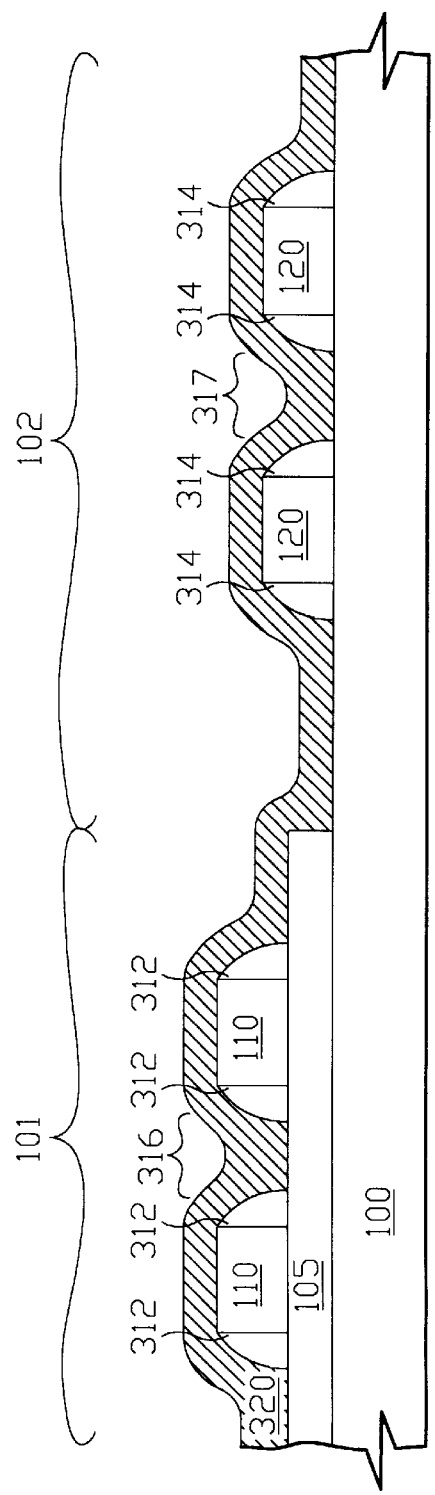
Figure 3E:
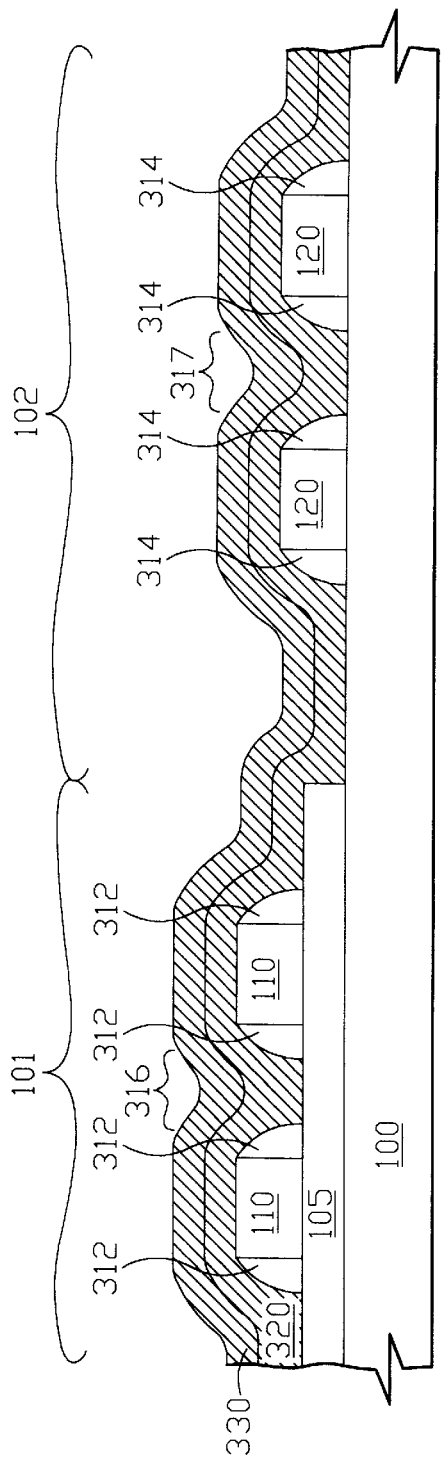
Figure 3F:
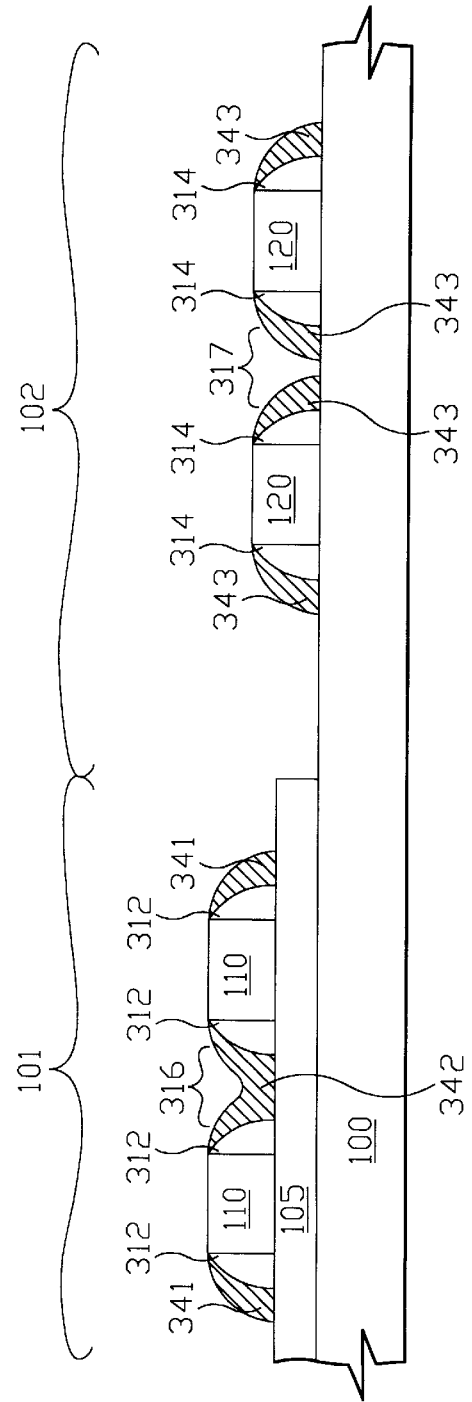

Afterward, as shown in FIG. 3B, a nitride layer 310 is conformally deposited to cover the surface of the array region 101, the gates 110 of memory cells, the peripheral region 102, and the gates 120 of transistors. Then, an etching step is performed to form the sidewall 312 of the gates 110 of the memory cells and the sidewall 314 of the gates 120 of the transistor, as shown in FIG. 3C. The width of these sidewalls is about 0.1 angstrom. The first spaced region 306 between two neighboring first transistors is therefore reduced and becomes a third spaced region 316, similarly, the second spaced region 307 between two neighboring second transistors is also reduced to become a fourth spaced region 317. But the width of the third spaced region 316 remains smaller than that of the fourth spaced region 317. Then, a first silicon oxide layer 320 is conformally deposited to cover the surface of the array region 20 101, the gates 110 of memory cells, the sidewall 312, the peripheral region 102, the gates 120 of the transistors, and sidewall 314, as shown in FIG. 3D. The thickness of the first silicon oxide layer is about 200 angstrom. Then, an ion implantation process is performed to form the drains and sources of the memory cells and the transistors (not shown). After the ion implantation process, an extra rapid thermal processing (RTP) may be performed. Then, a second silicon oxide layer 330 is deposited on the first silicon oxide layer 320, as shown in FIG. 3F. It should be noted that the thickness of the oxide layer deposited within the third spaced region 316 is larger than that of the oxide layer deposited in any other location, because the third spaced region 316 is narrower so that the rate of depositing is larger. However due to the wider width of the fourth spaced region 317, the oxide layer experiences no such phenomenon. The present design rule is the noted difference between this invention and the prior art.

Afterward, as shown in FIG. 3F, a selective etching process is performed to remove part of the first silicon oxide layer 320 and part of the second silicon oxide 330, so that the surface of the gates 110 of memory cells and the surface of the gates 120 of transistors is exposed, and the remaining oxide is usually in corners or within those spaced regions, such as the oxide layer 341, oxide layer 342, and oxide layer 343. The etching reagent has a larger etching rate to oxide than nitride. It should be mentioned that the etching process is controlled so the oxide layer 342 remains within the third spaced region 316, but the existence of the oxide layer 341 and oxide layer 343 is not critical.

Then, a photoresist layer 350 is deposited to cover the overall array region 101 and the overall peripheral region 102. The photoresist layer 350 is then patterned and etched, so that a part of the photoresist layer 350 in the peripheral region 102 is removed, as shown in FIG. 3G. Afterward, another selective etching process is performed to completely remove the oxide layer which is in the peripheral region 102, so the surface of the substrate 100 within the fourth spaced region 317 is exposed, as shown in FIG. 3H. Then, the photoresist layer 350 is removed, as shown in FIG. 3I.

Afterward, a metal layer 360, such as titanium, is deposited to cover the overall integral circuit, as shown in FIG. 3J. A heating process is then performed to make the metal react with the polysilicon to form metal silicide (362, 364, 366), as shown in FIG. 3K. Finally, the metal layer 360 is removed, as shown in FIG. 3L. Therefore, the method of locally forming metal silicide is completed. In addition, another kind of dielectric layer can replace the ONO layer 105 in the array region 101. An oxide layer is further composed between the gate 120 of transistor and the silicon substrate 100 and is used as a gate oxide layer.

Although specific embodiments have been illustrated and described, it will be obvious to those skilled in the art that various modifications may be made without departing from what is intended to be limited solely by the appended claims.

What is claimed is:

1. A method of locally forming metal silicide layers, said method comprising the steps of:

providing a silicon substrate, and said silicon substrate is divided into at least two regions: one is an array region, the other is a peripheral region forming a first dielectric layer on said silicon substrate within said array region and a plurality of first transistors on said first dielectric layer, wherein there is a first spaced region between any two neighboring gates of said plurality of first transistors;

forming a plurality of second transistors on said silicon substrate within said peripheral region, wherein there is a second spaced region between any two neighboring gates of said plurality of second transistors, and said second spaced region is larger than said first spaced region;

conformally depositing a nitride layer to cover said silicon substrate, said array region, and said peripheral region;

performing a first selective etching process to remove a partial said nitride layer, so that a plurality of first sidewalls of said plurality of first transistors and a plurality of second sidewalls of said plurality of second transistors are formed, wherein a partial region of said first spaced region is covered by said plurality of first sidewalls and a partial region of said second spaced region is covered by said plurality of second sidewalls;

depositing a first oxide layer to cover said array region, said peripheral region, said plurality of first transistors, said plurality of second transistors, said plurality of first sidewalls, and said plurality of second sidewalls;

performing an ion implantation to form drains and sources of said plurality of first transistors and said plurality of second transistors;

depositing a second oxide layer on said first oxide layer;

performing a second selective etching step to remove a part of said first oxide layer and a part of said second oxide layer, so that the surface of the gates of said plurality of first transistor and the gates of said plurality of second transistor is exposed, but the surface of the substrate within said first spaced region can not be exposed;

depositing a photoresist layer to cover overall said array region and overall said peripheral region;

removing a part of said photoresist layer within said peripheral region;

performing a third selective etching process to completely remove said first oxide layer and second oxide layer within said peripheral region by using said photoresist layer as a mask;

removing said photoresist layer;

depositing a metal layer to cover said silicon substrate, overall said array region, and overall said peripheral region;

performing a heating process to form metal silicide; and removing said metal layer.

2. The method according to claim 1, wherein said first dielectric layer is an oxide-nitride-oxide layer.

3. The method according to claim 1, said method further comprising a gate oxide between said silicon substrate and said gates of said plurality of second transistors.

4. The method according to claim 1, wherein the etching reagent of said first selective etching process is with a larger etching rate to nitride than oxide.

5. The method according to claim 1, wherein the etching reagent of said second selective etching process is with a larger etching rate to oxide than nitride.

6. The method according to claim 1, wherein the etching reagent of said third selective etching process is with a larger etching rate to oxide than nitride.

7. The method according to claim 1, wherein said metal layer is a titanium layer.

8. The method according to claim 1, said method comprising the step of a rapid thermal process after said step of performing an ion implantation.

9. A method of locally forming metal silicide layers, said method comprising the steps of:

providing a silicon substrate, and said silicon substrate is divided into at least two regions: one is an array region, the other is a peripheral region;

forming a first dielectric layer on said silicon substrate within said array region and a plurality of first transistors on said first dielectric layer, wherein there is a first spaced region between any two neighboring gates of said plurality of first transistors;

forming a plurality of second transistors on said silicon substrate within said peripheral region, wherein there is a second spaced region between any two neighboring gates of said plurality of second transistors, and said second spaced region is larger than said first spaced region;

conformally depositing a nitride layer to cover said silicon substrate, said array region, and said peripheral region;

performing a first selective etching process to remove a partial said nitride layer, so that a plurality of first sidewalls of said plurality of first transistors and a plurality of second sidewalls of said plurality of second transistors are formed, wherein a partial region of said first spaced region is covered by said plurality of first sidewalls and a partial region of said second spaced region is covered by said plurality of second sidewalls, and the etching reagent of said first selective etching process is with a larger etching rate to nitride than oxide;

depositing a first oxide layer to cover said array region, said peripheral region, said plurality of first transistors, said plurality of second transistors, said plurality of first sidewalls, and said plurality of second sidewalls;

performing an ion implantation to form drains and sources of said plurality of first transistors and said plurality of second transistors;

depositing a second oxide layer on said first oxide layer;

performing a second selective etching step to remove a part of said first oxide layer and a part of said second oxide layer, so that the surface of the gates of said plurality of first transistor and the gates of said plurality of second transistor is exposed, but the surface of the substrate within said first spaced region can not be exposed;

depositing a photoresist layer to cover overall said array region and overall said peripheral region;

removing a part of said photoresist layer within said peripheral region;

performing a third selective etching process to completely remove said first oxide layer and second oxide layer within said peripheral region by using said photoresist layer as a mask, wherein the etching reagent of said third selective etching process is with a larger etching rate to oxide than nitride;

removing said photoresist layer;

depositing a metal layer to cover said silicon substrate, overall said array region, and overall said peripheral region;

performing a heating process to form metal silicide; and removing said metal layer.

10. The method according to claim 9, wherein said first dielectric layer is an oxide-nitride-oxide layer.

11. The method according to claim 9, said method further comprising a gate oxide between said silicon substrate and said gates of said plurality of second transistors.

12. The method according to claim 9, wherein said metal layer is a titanium layer.

13. The method according to claim 9, said method comprising the step of a rapid thermal process after said step of performing an ion implantation.

* * * * *